United States Patent [19]

Kutsuki

[11] Patent Number: 4,958,228

[45] Date of Patent: Sep. 18, 1990

[54] AUTOMATIC FREQUENCY CHANGE DEVICE

[75] Inventor: Tetsuo Kutsuki, Osaka, Japan

[73] Assignee: Matsushita Electric Industrial Co., Ltd., Osaka, Japan

[21] Appl. No.: 303,345

[22] Filed: Jan. 30, 1989

[30] Foreign Application Priority Data

Oct. 19, 1988 [JP] Japan ................... 63-263225

[51] Int. Cl.$^5$ .................. H04N 5/04; H04N 5/12; H03L 7/00

[52] U.S. Cl. .................... 358/158; 358/148; 358/149; 331/20; 375/120

[58] Field of Search ............. 358/148, 149, 150, 152, 358/153, 154, 158; 331/1 A, 1 R, 20, 49; 375/119, 120

[56] References Cited

U.S. PATENT DOCUMENTS 4,510,461 4/1985 Dickes et al. ................ 331/2
4,688,082 8/1987 Kato ............................ 358/23

FOREIGN PATENT DOCUMENTS 2938780 3/1981 Fed. Rep. of Germany .......... 331/2

Primary Examiner—John W. Shepperd
Assistant Examiner—Michael D. Parker
Attorney, Agent, or Firm—Pollock, VandeSande & Priddy

[57] ABSTRACT

An analog-to-digital converter converts an input analog video signal into a corresponding digital video signal. A first input terminal of a phase comparator receives the digital video signal. A loop filter receives an output signal from the phase comparator. A digital-to-analog converter converts an output signal from the loop filter into a corresponding analog control signal. First and second voltage-controlled oscillators generate oscillation output signals having different frequencies respectively which depend on the analog control signal. A switch selects and outputs either of the oscillation output signals. A frequency divider divides a frequency of the selected oscillation output signal into a value corresponding to a horizontal frequency. The frequency divider supplies its output signal to a second input terminal of the phase comparator. A change circuit detects whether or not the output signal from the frequency divider remains out of synchronism with the digital video signal for a time equal to or longer than a reference time, and controls the switch to change the selected oscillation output signal from one to the other when the output signal from the frequency divider remains out of synchronism with the digital video signal for a time equal to or longer than a reference time.

1 Claim, 1 Drawing Sheet

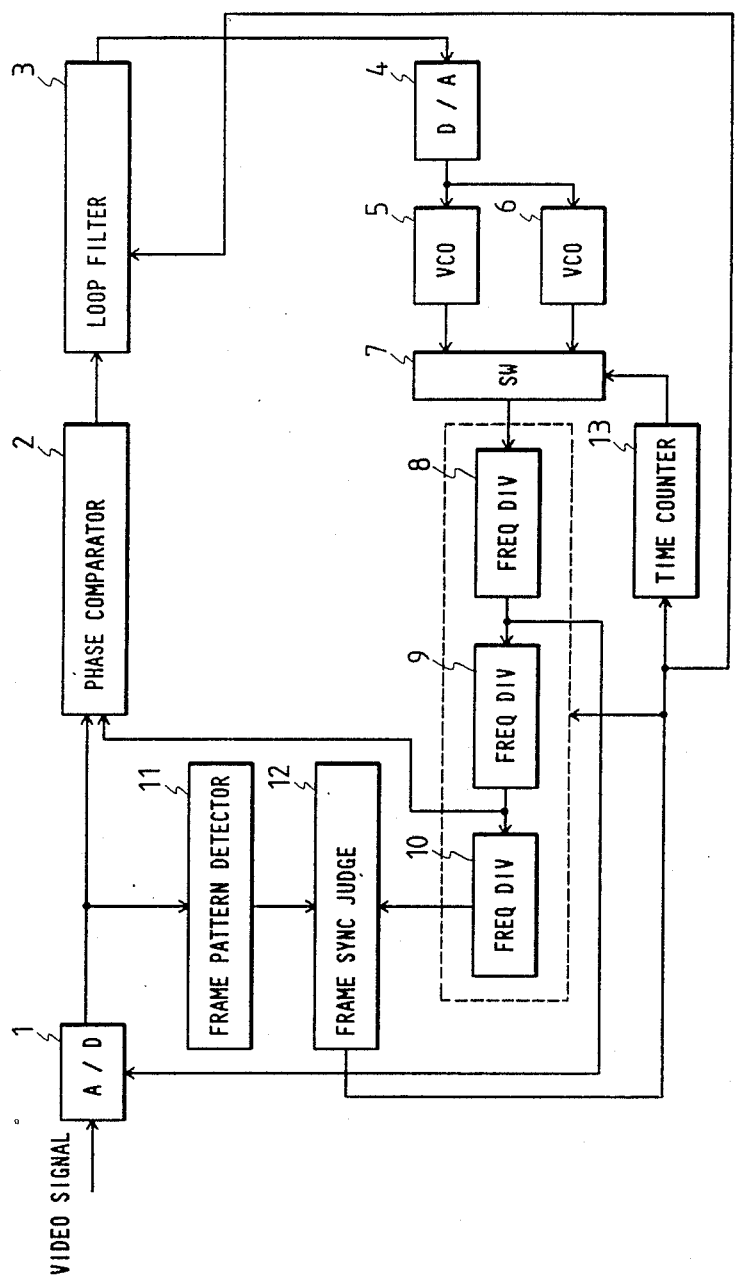

4,958,228

AUTOMATIC FREQUENCY CHANGE DEVICE

BACKGROUND OF THE INVENTION

This invention relates to an automatic frequency change device usable in a television receiver.

In television receivers capable of handling two different television signals having respective sync frequencies or field frequencies, a phase-locked loop (PLL) circuit includes two voltage-controlled oscillators (VCOs) corresponding to the respective television signals. One of the VCOs is selected and activated by operating a manual switch in accordance with which of the two television signals is inputted into the television receiver.

SUMMARY OF THE INVENTION

It is an object of this invention to provide a device which automatically selects and activates one of the VCOs in response to which of different television signals is inputted into a television receiver.

In an automatic frequency change device according to a first aspect of this invention, an analog-to-digital converter converts an input analog video signal into a corresponding digital video signal. A first input terminal of a phase comparator receives the digital video signal. A loop filter receives an output signal from the phase comparator. A digital-to-analog converter converts an output signal from the loop filter into a corresponding analog control signal. First and second voltage-controlled oscillators receive the analog control signal and generate oscillation output signals having different frequencies respectively which depend on the analog control signal. A switch receives the oscillation output signals and selects and outputs either of the oscillation output signals. A frequency divider divides a frequency of the selected oscillation output signal into a value corresponding to a horizontal frequency. The frequency divider supplies its output signal to a second input terminal of the phase comparator. A change circuit compares the digital video signal and the output signal from the frequency divider, detects whether or not the output signal from the frequency divider remains out of synchronism with the digital video signal for a time equal to or longer than a reference time, and controls the switch to change the selected oscillation output signal from one to the other when the output signal from the frequency divider remains out of synchronism with the digital video signal for a time equal to or longer than a reference time.

In an automatic frequency change device according to a second aspect of this invention, first and second voltage-controlled oscillators correspond to first and second video signals including sync signals having different frequencies respectively. Either of the first and second video signals is inputted into a phase-locked loop circuit. The first oscillator is initially selected and used in the phase-locked loop circuit. A detection is made as to whether the phase-locked loop circuit is out of lock with the sync signal of the input video signal. A determination is made as to whether or not the phase-locked loop circuit remains out of lock for a predetermined interval. The first oscillator is automatically replaced by the second oscillator and thus the second oscillator is used in the phase-locked loop circuit when the phase-locked loop circuit remains out of lock for the predetermined interval.

In an automatic frequency change device according to a third aspect of this invention, first and second voltage-controlled oscillators correspond to first and second video signals including sync signals having different frequencies respectively. Either of the first and second video signals is inputted into a phase-locked loop circuit. A detection is made as to which of the first and second video signals is currently inputted into the phase-locked loop circuit. One of the first and second oscillators which corresponds to the currently inputted video signal is automatically selected and is used in the phase-locked loop circuit.

BRIEF DESCRIPTION OF THE DRAWING

The FIGURE is a block diagram of an automatic frequency change device according to an embodiment of this invention.

DESCRIPTION OF THE PREFERRED EMBODIMENT

With reference to the FIGURE, an automatic frequency change device is generally provided in a television receiver capable of handling either of first and second analog video signals having different sync frequencies or field frequencies respectively. Either of the first and second analog video signals is inputted into the television receiver. The input analog video signal is applied to an analog-to-digital (A/D) converter 1 and is converted by the A/D converter 1 into a corresponding digital video signal. Specifically, the A/D converter 1 samples the input analog video signal at timings determined by sampling clocks and transforms the sampled analog signal into a corresponding digital signal. The output digital video signal from the A/D converter 1 is applied to a first input terminal of a phase comparator 2. A second input terminal of the phase comparator 2 is subjected to an output signal from a frequency divider 9 described hereinafter. The phase comparator 2 serves to compare the phase of a horizontal sync signal in the digital video signal with the phase of the output signal from the frequency divider 9. The phase comparator 2 outputs a digital signal representative of the difference between the compared phases. The output signal from the phase comparator 2 is processed by a resettable loop filter 3. The loop filter 3 serves to integrate the phase difference. The loop filter 3 is reset by a pulse supplied from a frame sync judgment circuit 12 described hereinafter. A digital output signal from the loop filter 3 which represents an integral of the phase difference is converted by a digital-to-analog (D/A) converter 4 into a corresponding analog voltage signal.

The output voltage signal from the D/A converter 4 is applied to control terminals of VCOs 5 and 6. The VCOs 5 and 6 output signals having different frequencies respectively which depend on the level of the input voltage signal. The ratio between the oscillation frequencies of the VCOs 5 and 6 which occur in response to a common input signal is chosen to correspond to the ratio between the sync frequencies of the first and second analog video signals. The VCOs 5 and 6 are designed to correspond to the first and second analog video signals respectively. A switch 7 selects either of the output signals from the VCOs 5 and 6 and passes the selected signal to a frequency divider 8. The frequency divider 8 outputs a signal having a frequency which equals the frequency of the input signal divided by a predetermined factor. The output signal from the frequency divider 8 is applied to the frequency divider 9. In addition, the output signal from the frequency divider 8 is used as the sampling clocks in the A/D converter 1. The frequency divider 9 outputs a signal having a frequency which equals the frequency of the input signal divided by a predetermined factor. The frequency divider 9 is designed so that the frequency of its output signal will correspond to the frequency of the horizontal sync signal in the input video signal. As described previously, the output signal from the frequency divider 9 is applied to the phase comparator 2. In addition, the output signal from the frequency divider 9 is applied to a frequency divider 10. The frequency divider 10 outputs a signal having a frequency which equals the frequency of the input signal divided by a predetermined factor. The frequency divider 10 is designed so that the frequency of its output signal will correspond to a frame frequency of the input video signal. The frequency dividers 8-10 are of the resettable type, being reset by pulses supplied from a frame sync judgment circuit 12 described hereinafter.

The output signal from the frequency divider 10 is applied to a first input terminal of a frame sync judgment circuit 12. The digital video signal is transmitted from the A/D converter 1 into a frame pattern detector 11. The frame pattern detector 11 extracts a frame pattern signal or a frame sync signal from the input digital video signal. The frame pattern signal is applied from the frame pattern detector 11 to a second input terminal of the frame sync judgment circuit 12. The frame sync judgment circuit 12 compares the phases of the frame pattern signal and the divider output signal and determines whether or not the divider output signal is in synchronism with the frame pattern signal, that is, whether or not the frame sync is in lock. The frame sync judgment circuit 12 outputs a control signal to the loop filter 3, the frequency dividers 8-10, and a time counter 13, the control signal being dependent on whether or not the frame sync is in lock. The control signal outputted to the loop filter 3 and the frequency dividers 8-10 serve as reset pulses which are generated at a rate corresponding to the frame frequency of the input video signal. The control signal outputted to the time counter 13 serves to interrupt time counting operation of the time counter 13. The time counter 13 measures the time "t" elapsed since the moment of the activation of the automatic frequency change device or the television receiver and compares the elapsed time "t" with a predetermined reference time "to". The time counter 13 outputs a binary control signal to the switch 7, the control signal being generally dependent on whether or not the elapsed time "t" is shorter than the reference time "to". In addition, the control signal to the switch 7 depends on the control signal to the time counter 13. The time counter 13 preferably includes a clock generating section, a counting section, and a comparing section. When the automatic frequency change device or the television receiver is turned on, the counting section starts to count clocks generated by the clock generating section. The comparing section compares an output signal from the counting section with a reference signal representative of the reference time "to", and generates the switch control signal. The switch 7 selects one of the output signals from the VCOs 5 and 6 and passes the selected signal to the frequency divider 8 in accordance with the switch control signal supplied from the time counter 13. The switch control signal is designed so that the output signal from the VCO 5 will be selected initially when the automatic frequency change device or the television receiver is turned on.

The phase comparator 2, the loop filter 3, the D/A converter 4, selected one of the VCOs 5 and 6, and the frequency dividers 8 and 9 form a phase-locked loop (PLL) circuit. This PLL circuit functions to lock the output signal from the frequency divider 9 with the horizontal sync signal of the output signal from the A/D converter 1. Specifically, the PLL circuit serves to maintain the output signal from selected one of the VCOs 5 and 6 in a fixed phase and frequency relationship with the horizontal sync signal of the input video signal.

It is now assumed that the first analog video signal is inputted into the television receiver. When the television receiver is turned on, the output signal from the VCO 5 is selected and passed to the frequency divider 8 by the switch 7. Since the VCO 5 corresponds to the first video signal, the frame sync is quickly locked. Accordingly, the frame sync judgment circuit 12 outputs a control signal representing that the frame sync is in lock, the control signal being transmitted to the time counter 13 before the elapsed time "t" reaches the reference time "to". The control signal interrupts the counting operation of the time counter 13 so that the switch control signal remains at the initial state where the output signal from the VCO 5 is selected by the switch 7. In this way, the output signal from the VCO 5 remains selected by the switch 7.

It is now assumed that the second analog video signal is inputted into the television receiver. When the television receiver is turned on, the output signal from the VCO 5 is selected and passed to the frequency divider 8 by the switch 7. Since the VCO 5 does not correspond to the second video signal, the frame sync will not be locked as long as the output signal from the VCO 5 remains selected. Accordingly, as long as the output signal from the VCO 5 remains selected, the frame sync judgment circuit 12 will not output a control signal representing that the frame sync is in lock. Thus, the time counter 13 keeps its counting operation. When the elapsed time "t" reaches the reference time "to", the time counter 13 changes the state of the switch control signal so that the output signal from the VCO 6 is selected and passed to the frequency divider 8 by the switch 7 in place of the output signal from the VCO 5. Thereafter, the output signal from the VCO 6 remains selected by the switch 7.

What is claimed is:

1. An automatic frequency change device comprising:
   an analog-to-digital converter converting an input analog video signal into a corresponding digital video signal;
   a phase comparator having a first input terminal receiving the digital video signal;
   a loop filter receiving an output signal from the phase comparator;
   a digital-to-analog converter converting an output signal from the loop filter into a corresponding analog control signal;
   first and second analog voltage-controlled oscillators receiving the analog control signal and generating oscillation output signals having different frequencies which depend upon the analog control signal;
   a switch receiving the oscillation output signals and selecting and outputting either of the oscillation output signals;
   a first frequency divider dividing a frequency of the selected oscillation output signal into a value corresponding to a horizontal frequency, the first frequency divider supplying its output signal to a second input terminal of the phase comparator;

a second frequency divider dividing a frequency of the output signal from the first frequency divider into a value corresponding to a frame frequency;

means for extracting a frame pattern signal from the digital video signal; and change means for comparing the frame pattern signal of the digital video signal and the output signal from the second frequency divider, detecting whether or not the output signal from the second frequency divider remains out of synchronization with the digital video signal for a time equal to or longer than a reference time, and controlling the switch to change the selected oscillation output signal from one to the other when the output signal from the second frequency divider remains out of synchronization with the digital video signal for a time equal to or longer than the reference time.

* * * * *